US012453068B2

(12) United States Patent
Axelsson

(10) Patent No.: US 12,453,068 B2
(45) Date of Patent: Oct. 21, 2025

(54) MOUNTING TOOL FOR A COMPONENT MOUNTING MACHINE

(71) Applicant: Mycronic AB, Taby (SE)

(72) Inventor: Robert Axelsson, Jarfalla (SE)

(73) Assignee: Mycronic AB, Taby (SE)

( * ) Notice: Subject to any disclaimer, the term of this patent is extended or adjusted under 35 U.S.C. 154(b) by 539 days.

(21) Appl. No.: 17/767,222

(22) PCT Filed: Dec. 4, 2020

(86) PCT No.: PCT/EP2020/084707
§ 371 (c)(1),
(2) Date: Apr. 7, 2022

(87) PCT Pub. No.: WO2021/110953
PCT Pub. Date: Jun. 10, 2021

(65) Prior Publication Data
US 2022/0377952 A1    Nov. 24, 2022

(30) Foreign Application Priority Data
Dec. 6, 2019 (EP) ..................... 19214039

(51) Int. Cl.
*H05K 13/04* (2006.01)
(52) U.S. Cl.
CPC ....... *H05K 13/041* (2018.08); *H05K 13/0409* (2018.08); *H05K 13/0417* (2013.01)
(58) Field of Classification Search
CPC ............. H05K 13/0409; H05K 13/041; H05K 13/0417
See application file for complete search history.

(56) References Cited

U.S. PATENT DOCUMENTS 6,336,268 B1    1/2002  Inutsuka et al.
8,220,787 B2 *  7/2012  Noda ................ H01L 21/67144
                                                    269/291
(Continued)

FOREIGN PATENT DOCUMENTS

CN    101677060 A    3/2010
DE       249591 A1    9/1987
(Continued)

OTHER PUBLICATIONS

Office Action issued Dec. 27, 2023 in Chinese Application No. 202080080754.6 (English translation).
(Continued)

*Primary Examiner* — Minh N Trinh
(74) *Attorney, Agent, or Firm* — Harness, Dickey & Pierce, P.L.C.

(57) ABSTRACT

The present invention provides a mounting tool tip arranged for being releasably mounted to mounting tool of a component mounting machine, said mounting tool being rotatably arranged in said component mounting machine around a vertical rotational axis. The mounting tool tip comprises a tip portion at a first end and arranged for engagement with a component to be mounted in a component mounting machine; engagement means for mounting said mounting tool tip to said mounting tool. Further, the engagement means is arranged at a second end opposite said first end and further configured such that said tip portion is off-center in a horizontal direction compared to said rotational axis when the mounting tool tip is mounted to said mounting tool. The present invention further provides a mounting tool, a mount head, a component mounting machine as well as method for simultaneously picking at least two components arranged in adjacent component tapes in a component mounting machine.

3 Claims, 5 Drawing Sheets

(56) References Cited

U.S. PATENT DOCUMENTS

| | | | | |
|---|---|---|---|---|
| 2012/0139366 A1* | 6/2012 | Yman | ................... | H05K 13/04 |
| | | | | 310/12.29 |
| 2017/0311493 A1 | 10/2017 | Ito et al. | | |
| 2022/0377952 A1* | 11/2022 | Axelsson | ............. | H05K 13/041 |

FOREIGN PATENT DOCUMENTS

| | | |
|---|---|---|
| DE | 4301043 C1 | 5/1994 |
| EP | 2012576 A2 | 1/2009 |
| EP | 2242348 A1 | 10/2010 |
| EP | 3211983 A1 | 8/2017 |
| JP | H0715181 A | 1/1995 |
| RU | 2013111068 A | 9/2014 |
| WO | WO-2009/091061 A1 | 7/2009 |

OTHER PUBLICATIONS

International Search Report PCT/ISA/210 for International Application No. PCT/EP2020/084707 dated Feb. 26, 2021.

\* cited by examiner

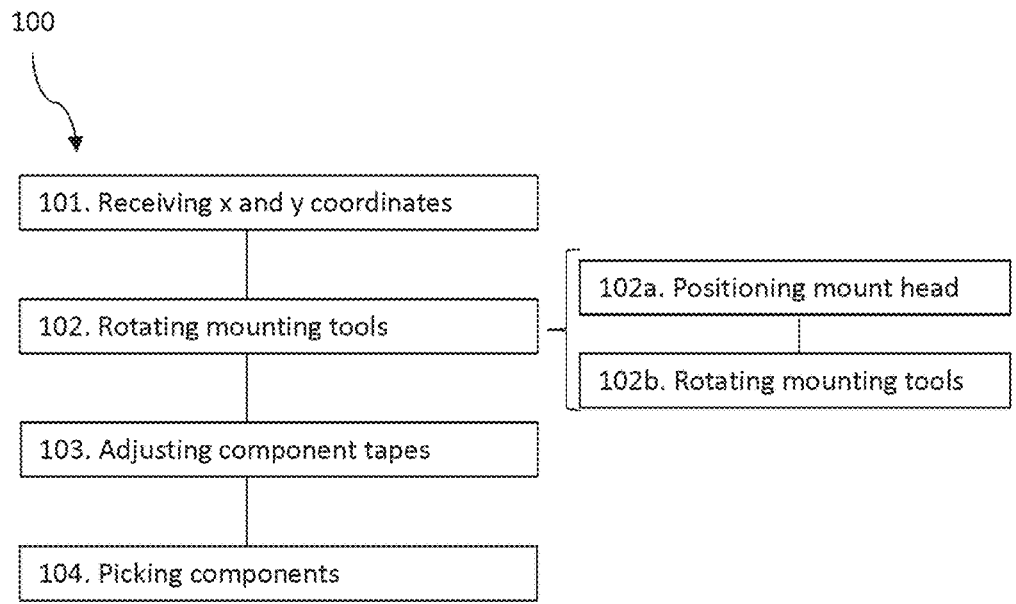
*Fig. 4b*
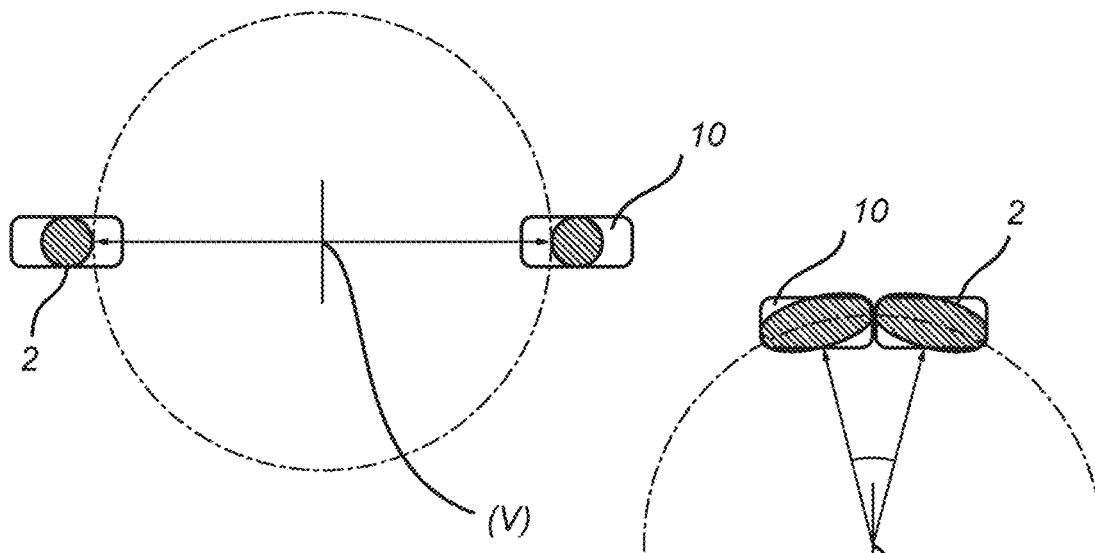
*Fig. 5a*
*Fig. 5b*
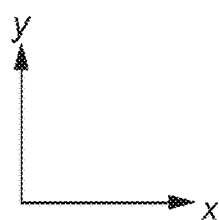

MOUNTING TOOL FOR A COMPONENT MOUNTING MACHINE

CROSS-REFERENCE TO RELATED APPLICATIONS

This application is a national phase under 35 U.S.C. § 371 of PCT International Application No. PCT/EP/2020/084707 which has an International filing date of Dec. 4, 2020, which claims priority to EP Application Serial No. 19214039.0, filed Dec. 6, 2019, the entire contents of each of which are hereby incorporated by reference.

TECHNICAL FIELD

The present inventive concept relates to the field of pick and place technology. More particularly, it relates to a mounting tool and a mounting tool tip for simultaneous pick of components.

BACKGROUND

Machines for pick-and-place mounting of components on a workpiece, such as a Printed Circuit Board (PCB), or a substrate for a System in Package (SiP), are subject to different, often contradictory demands, such as mounting speed, mounting precision, size, price, etc. The expression "pick and place" may be understood by the person skilled in the art as describing the very mounting operation where a mounting head is moved to a component feeder area, where the mounting head picks one or more components from one or more of the component feeders, and then is moved to a mounting area where the mounting head places the component or components on the workpiece.

The electronic components may be provided by means of several component tapes wound on reels and stored in a magazine configured to be inserted into the component mounting machine.

The mount head of a pick-and-place machine may comprise several mounting tools for picking a plurality of components. As an example, the mounting tools may be arranged in a row (a piano-type mount head). A mounting tool may thus function as a nozzle for engaging with the component to be picked, and each mounting tool may be designed for picking a single component.

During the picking operation, the component feeders feed components to a picking position. If several component tapes and feeders are arranged next to each other, it facilitates a "simultaneous pick" of a mount head, i.e. an operation in which different mounting tools of the mount head engage with components from different component tapes.

However, the distance between components to pick, such as the distance between components of different component tapes, and the distance between the mounting tools of a mount head performing the pick may not be the same. The difference in distance between components position and mounting tool position is because of several tolerances exist between nozzles and components. For reliable pick of components, tool position should not be far from component center relative component size.

However, it is need in the art for using components tapes of smaller width, meaning that components displaced by the feeders next to each other from different component tapes becomes smaller. This may make a simultaneous pick using a piano-type mount head even more difficult, and it risks not using all mounting tools of a mount head during each pick.

Thus, there is a need for improved solutions for performing simultaneous pick of components from different component tapes, especially from component tapes of smaller width.

SUMMARY

It is an object of the invention to at least partly overcome one or more limitations of the prior art. In particular, it is an object to provide a solution that facilitates simultaneous pick of several components in a pick-and-place machine.

As a first aspect of the invention, there is provided a mounting tool tip arranged for being releasably mounted to a mounting tool of a component mounting machine, the mounting tool being rotatably arranged in the component mounting machine around a vertical rotational axis (V), wherein the mounting tool tip comprises a tip portion at a first end and arranged for engagement with a component to be mounted in a component mounting machine;

engagement means for mounting the mounting tool tip to the mounting tool, wherein the engagement means is arranged at a second end opposite the first end and further configured such that the tip portion is off-center in a horizontal direction compared to the rotational axis (V) when the mounting tool tip is mounted to the mounting tool.

A mounting tool tip is thus the part of a component mounting machine that actually engages with the components that are to be picked. It can be releasably mounted to a mounting tool of a component mounting machine and may thus function as a spare part to the mounting tool. The mounting tool itself is rotatably mounted in a component mounting machine and the mounting tool tip, when mounted to the mounting tool, is thus also rotatably mounted in the component mounting machine.

The mounting tool tip comprises a tip portion at a first end and engagement means at a second end. When mounted to a mounting tool, the first end thus forms a vertically lower end, whereas the second end forms a vertically upper end. The tip portion, i.e. the "tip" of the mounting tool tip, engages with a component to be picked whereas the engagement means is for attachment to the mounting tool when mounted.

The mounting tool may for example comprise a tip holder, and the mounting tool may be configured to be rotatably mounted around vertical axis (V) in a component mounting machine.

The engagement means may be configured to form a press fit or friction fit with the mounting tool. The engagement means may for example comprise at least one pin that is configured to be press fitted or friction fitted into a receiving hole or slit of the mounting tool.

The engagement means may be may be configured such that the mounting tool tip is releasable from the mounting tool, such as in the form of a snap on that is fastened to the mounting tool.

As a further example, the engagement means may be configured to permanently fasten the mounting tool tip to the mounting tool, e.g. be in the form of a surface for an adhesive that is used to fasten the mounting tool tip to the mounting tool.

The engagement means is further arranged so that the tip portion is not aligned with the rotational axis (v) of the mounting tool. Instead, when mounted, the tip portion is off center in a horizontal direction as compared to the rotational axis (V). In other words, the surface of the tip portion that is configured to engage with a component is off-center as compared to the rotational axis (V). This makes it possible to adjust the position of the tip portion simply by rotating the mounting tool instead of adjusting the position of e.g. a whole mount head.

The tip portion may thus be the tip of a nozzle configured for engaging with a component to be picked.

The engagement means may for example be arranged so that is not vertically aligned with the tip portion.

Thus, when mounted in a mounting tool, the direction between the first and second ends may be parallel to the rotational axis (V), but may not overlap with rotational axis (V).

The first aspect of the invention is based on the insight that having a tip portion configured such that the x and y coordinates in a horizontal plane may be adjusted by a rotational movement of the mounting tool facilitates fine tuning of the picking coordinates. Thus, during operation, a mount head may be positioned with its mounting tools as close to the component coordinates as possible, and more precise adjustments may be performed by rotation around rotational axis (V).

A component mounting machine mounted with at least two mounting tool tips of the first aspect will be able to pick and place small components with higher speed with reliable pick of components. The traditional trade of between reliable pick and high placement speed may thus be reduced using the mounting tool tip of the first aspect.

As an example, the mounting tool tip may be arranged for picking 1005 metric components or smaller. "1005 metric" denotes the manufacturing standard code for components having dimensions of 1.0*0.5 mm (length*width).

The mounting tool tip may have any suitable shape, such as having a wider base portion at the second end and a more narrow tip portion at the first end for engaging with the component to be picked.

In embodiments of the first aspect, the tip portion has a frustoconical shape with the base facing the second end.

Thus, the tip portion may have the form of a truncated cone in which the "sharpest" end is configured to engage with a component to be picked, i.e. facing the first end of the mounting tool tip. The "base" of the frustoconical shape thus faces the second end. As an example, the engagement means may be arranged on the base of the frustoconical shape.

However, the tip portion may also have a pyramid shape, with the base facing the second end. The engagement means may thus be arranged on the base of the pyramid shape.

In embodiments of the first aspect, the engagement means are arranged such that the tip portion is off center with at least 100 μm, such as at least 200 μm, such as at least 250 μm.

Thus, the distance between the rotational axis and the tip portion at the first end may be at least 100 μm, such as at least 200 μm, such as at least 250 μm, when mounted in a mounting tool.

In embodiments of the first aspect, the tip portion further comprises an air channel having an end at the first end. This may be used for adjusting the air pressure at the tip portion, thereby facilitating the picking of a component. The air channel may thus be configured for applying a vacuum at the tip portion.

As an example, the air channel may extend from the first end to the second end of the mounting tool tip.

In embodiments of the first aspect, the tip portion has a circular cross-section in the horizontal plane.

Thus, the outermost part of the tip portion may have a circular cross section. This is advantageous in that the part engaging with the component is rotationally symmetric. In other words, if the tip portion has been subjected to a rotational movement relative the horizontal plane on which the components are fed in the component mounting machine, the surface engaging with the component is the same. Thus, a tip portion having circular cross-section may easily be rotated for fine-tuning the x and/or y position to match a components x and/or y position and still have the same pickup are.

However, in embodiments of the first aspect, the tip portion has a frusto-oval cross-section in the horizontal plane.

In the context of the present disclosure, a "frusto-oval cross section" means an oval shaped cross section along at least a portion of the cross-section, wherein the remaining portion of the cross section can be truncated or have a non-oval shape. The tip portion having a frusto-oval cross section may thus have "rice-shaped" cross section.

A tip portion having a frusto-oval cross section may be rotated to some degree but still maintain a large area for picking up components.

As a second aspect of the invention, there is provided mounting tool for picking and placing a component in a component mounting machine, wherein the mounting tool comprises
  a base portion arranged at an upper end of the mounting tool,
  a tip holder extending from the base portion in the vertical direction and mounted in the base portion around a vertical rotational axis (V);
  a mounting tool tip attached to the tip holder at a lower end of the mounting tool and arranged for engagement with a component to be mounted, and wherein
  the mounting tool is configured such that the tip portion of the mounting tool tip is off-center in a horizontal direction compared to the rotational axis (V).

This aspect may generally present the same or corresponding advantages as the former aspect. Effects and features of this second aspect are largely analogous to those described above in connection with the first aspect. Embodiments mentioned in relation to the first aspect are largely compatible with the second aspect.

The upper end of the mounting tool may thus be a vertically upper portion. The base portion may be adapted for engagement with a mount head of a component mounting machine. The tip holder may be arranged within the base portion and may extend out from the base portion. Thus, the base portion may thus have an opening through which the tip holder extends. The tip holder is further arranged for holding a mounting tool tip. The mounting tool tip may be removable from the tip holder.

Further, the mounting tool is configured such that the tip portion is off-center as compared to the rotational axis Z. Thus, in embodiments, the mounting tool tip is a mounting tool tip of the first aspect above. However, other parts, such as the tip holder, may be arranged such that any tip being attached to the tip holder is off-center.

In embodiments of the second aspect, the tip holder is spring loaded in the base portion with a coiled spring extending in the vertical direction around vertical axis (V) and attached to the tip holder such that the tip holder may be pressed down in the vertical direction against the elastic force of the coiled spring upon engagement with a component to be mounted.

The tip holder may thus be slidingly arranged within the base portion such that it may slide vertically relative the base portion against the force of the coiled spring, such as when it is being pressed with a vertical force. This may for example be when engaging a component to be picked. The coiled spring may be arranged around the tip holder within the base portion. Further, a spring-loaded tip holder reduces impact forces when components are picked and placed at high speed.

In embodiments of the second aspect, the vertically lowermost portion of the tip holder is a releasable portion that is releasably mounted to the rest of the tip holder and wherein the mounting tool tip is attached to the releasable portion.

The tip holder may thus comprise two parts, an upper portion arranged within the base portion of the mounting tool, and a lower releasable portion that may be released from the upper portion, thus allowing for changing the mounting tool tip.

If the lowermost portion of the tip holder is a releasable portion, then the base portion and the rest of the tip holder may be an integrated part of a mount head of a component mounting machine. Thus, the whole mounting tool does not need to be releasable from the mount head, just the lowermost releasable portion of the tip holder.

In embodiments of the second aspect, the tip holder comprises a vertical shaft portion that is off center as compared to the rotational axis (V) when the tip holder is attached to the base portion.

Thus, the tip holder may be arranged such that the mounting tool tip is off-center in a horizontal direction compared to the rotational axis (V) when mounted to the tip holder. The vertical shaft portion may be the releasable portion as discussed above.

However, as an alternative, the tip holder may comprise a vertical shaft portion that is aligned with the rotational axis. In such embodiment, the mounting tool tip may be as defined in relation to the first aspect herein above.

In embodiments of the second aspect, the mounting tool further comprises an air channel having an end at the tip portion of the mounting tool tip. As discussed in relation to the first aspect above, such an air channel may be used for applying a vacuum at the tip portion, thereby facilitating picking of a component.

In embodiments, the tip holder comprises at least one receiving structure for receiving engagement means of the mounting tool tip. The receiving structure may for example be configured to allow the tip holder to be engaged by means of a spring lock, friction fitted or a magnet.

As an example, the tip holder may comprise at least one receiving hole or slit for receiving engagement means of the mounting tool tip. The receiving hole or slit may be configured such that the mounting tool tip is press fitted or friction fitted to the tip holder.

As a third aspect of the invention, there is provided a mount head for picking and placing a plurality of components in a component mounting machine, the mount head comprising at least two mounting tools according to the second aspect discussed above arranged adjacent to each other along a horizontal axis (H) and rotatably arranged around individual vertical rotational axes (V).

The mount head may thus be a mount head of "piano" type, i.e. a mount head comprising a plurality of mounting tools arranged in a row. At least two of the mounting tools, such as all of the mounting tools, may be mounting tools as of the second aspect discussed herein above.

The mount head may thus be adapted to receive at least two mounting tools arranged along a horizontal axis H.

The mount head may thus be arranged to be moved in a horizontal direction during operation, i.e. when arranged in a component mounting machine.

Furthermore, the mount head may comprise an air channel connected to an air channel of the mounting tool for applying a vacuum at the tip portion, as discussed in relation to the first and second aspects above. Further, the mount head, or the component mounting machine to which the mount head is mounted may comprise means, such as a vacuum pump, for applying a vacuum via the air channel to the tip portion of the mounting tool tip.

As a fourth aspect of the invention, there is provided a component mounting machine comprising a mount head according to the third aspect above.

The component mounting machine may be a pick and place (PnP) machine, such as a PnP machine for mounting electronic components on a Printed Circuit Board (PCB). Thus, the components may be electronic components. The electronic components include for example resistors, capacitors and transistors.

The component mounting machine may be configured for receiving a plurality of tape reels onto which the components to be mounted are stored. The component mounting machine may thus comprise a machine frame arranged for receiving a source of electronic components, such as electronic components mounted in tape reels and magazines. These may for example be arranged within a feeder area of the machine frame.

The component mounting machine may comprise a control unit configured for controlling the rotation of the mounting tools of the mount head around their around individual vertical rotational axes (V).

As a fifth aspect of the invention, there is provided a method for simultaneously picking at least two components arranged in adjacent component tapes in a component mounting machine according to the fourth aspect above with a mount head, the method comprising the steps of
a) receiving x and y coordinates of the at least two components in a horizontal plane perpendicular to the rotational axes (V);
b) positioning the mounting tools of the mount head to the x coordinate of the at least two components
c) adjusting the component tapes in the y direction to the y coordinate of the at least two components; thereby aligning the components under the tip portions of the mount head; and
d) picking the at least two components with the mount head.

Step b) may comprise a first step of aligning the mount head over the at least two components such that the tip portions of the mount head is as close to the received x coordinates as possible without rotational movement of the mounting tools. Then, fine-tuning of the x position may be achieved by rotational movement of the mounting tools. Consequently, step b) may comprise the steps
b1) positioning the mount head such that the x coordinates of at least two mounting tools match the received x coordinates with a first positing error; and
b2) rotating the mounting tools of the mount head to the x coordinate of the at least two components to match the received x coordinates with a positioning error that is better than the first positioning error.

Step c) may be achieved e.g. by component feeders, i.e. components of the component mounting machine that are arranged for feeding component tapes comprising the components to be picked to a picking position of the component mounting machine. The feeders may thus be configured for feeding the component tape in the horizontal plane, and the x and y coordinates of the components in this plane is received in step a).

Step d) may comprise vertically engaging the tip portions of the mount head with the at least two components to be picked.

The method of the fifth aspect is makes it possible to adjust the mounting tools in x and y positions relative the components to be picked. Due to the tip portions being arranged off-center relative the rotational axes of the mounting tools, the tip portions may be adjusted to the center of each component to pick by a rotational movement of the mounting tools. Thus, in short, the method comprises adjusting the x position of the tip portions by rotation of the mounting tools to a degree that gives x position same as the component center in x direction. The y position is then adjusted by adjusting the pick position of the components such that the y position of the mounting tool is the same as the component center. This may comprise adjusting the pick position of the component at the picking position in the component mounting machine, such as in a magazine that feeds component tape.

In embodiments of the fifth aspect, the horizontal distance between the vertical rotational axes (V) of two adjacent mounting tools is larger than the horizontal distance between the components that are simultaneously picked from the two adjacent component tapes.

Thus, the method makes it possible to simultaneously pick components on component tapes that are arranged close to each other even though the distance between mounting tools, i.e. distance between the rotational axes of the mounting tools, are larger than the distance between components on different component tapes.

In embodiments of the fifth aspect, the horizontal distance between the vertical rotational axes (V) of two adjacent mounting tools is smaller than the horizontal distance between the components that are simultaneously picked from the two adjacent component tapes.

The method of the fifth aspect thus also makes it possible to simultaneously pick components on tapes that are further apart than the distance between the mounting tools.

As discussed in relation to the fourth aspect above, the component mounting machine may comprise a control unit configured for controlling the rotation of the mounting tools of the mount head around their around individual vertical rotational axes (V).

Thus, the control unit may comprise computer program products configured for performing the method steps of the fifth aspect described above The control unit may comprise a processor and communication interface for communicating with the mount head and thus for receiving information about the x and y coordinates of the components that are to be picked.

Hence, the control unit may further comprise computer program products configured for sending operational requests to the mount head. The operational requests may be based on received information about the x and y coordinates of the components to be picked and the x and y positions of the mounting tools of the mount head.

For this purpose, the control unit may comprise a processing unit such as a central processing unit, which is configured to execute computer code instructions which for instance may be stored on a memory.

Consequently, as a sixth aspect of the invention, there is provided a computer program product comprising a computer-readable storage medium with computer code instructions adapted to carry out the method of the fifth aspect when executed by a device having processing capability.

The computer-readable storage medium may be any tangible medium that may facilitate transport of the computer program product. For instance, the computer-readable medium may be a portable physical memory, such as a universal serial bus (USB) stick, a compact disc (CD) or a digital versatile disc (DVD). The computer program product may also or alternatively be stored on a memory, such as a random access memory (RAM) or a read-only memory (ROM), which may be accessible to a processing unit of a computer.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIG. 5 illustrate two different tip portions.

DETAILED DESCRIPTION

Figure 1A:
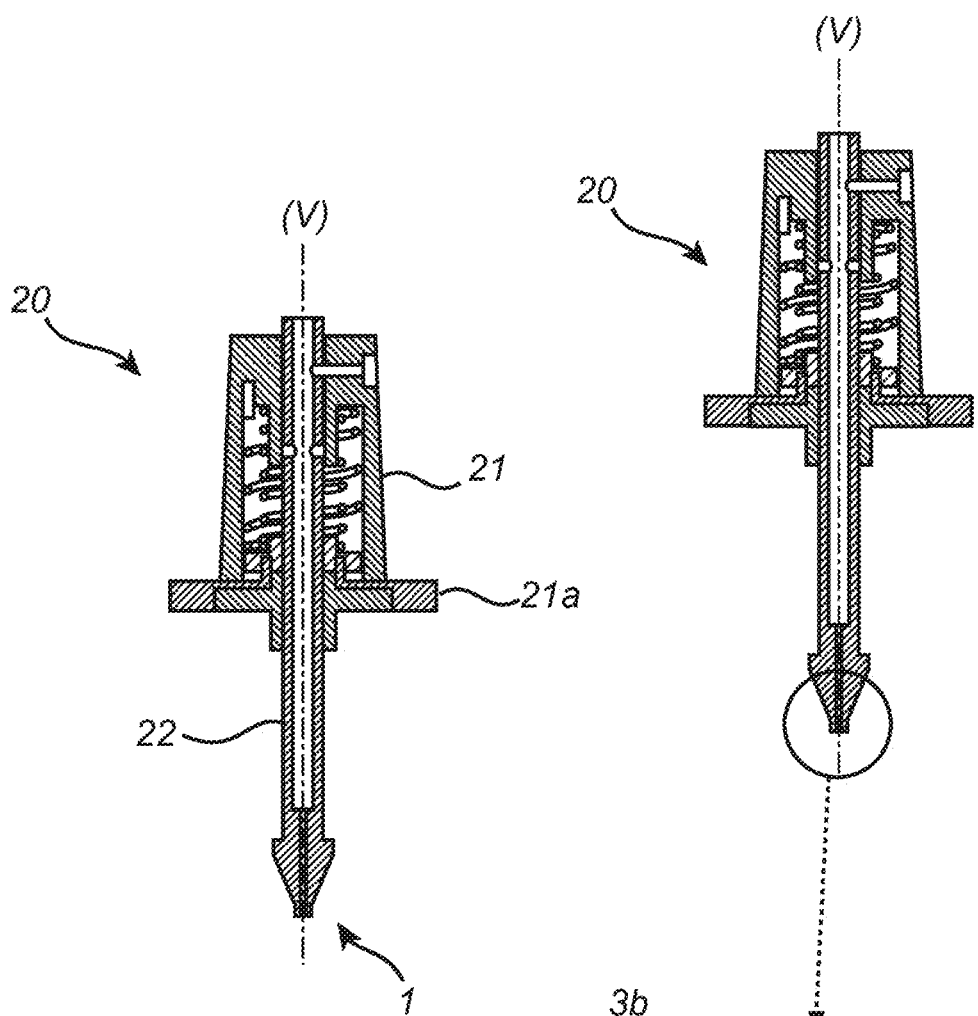
FIG. 1a is a schematic illustration of a mounting tool.

FIG. 1a is a side section view of a mounting tool 20 for picking and placing a component in a component mounting machine. The mounting tool 20 may be rotatably arranged in a component mounting machine around a vertical rotational axis (V).

The mounting tool 20 comprises a base portion 21 arranged at an upper end of the mounting tool 20 and a tip holder 22 extending from the base portion 21 in the vertical direction. The base portion is in adapted to engage with a mount head such that the mounting tool 20 may be releasably attached to a mount head. The base portion has in this example a frustoconical shape with the base arranged at the vertically lower portion. There is also a flange 21a which is used for mounting the mounting tool to other units, such as a mount head of a component mounting machine. As an example, the flange 21a may have recesses that allows for locking the mounting tool in place in a mount head. The tip holder 22 extends out from the base portion 21, i.e. the base portion 21 encloses the upper portion of the tip holder.

The tip holder is further mounted in the base portion 21 around a vertical axis (V), e.g. by means of one or several plain bearings (not shown). When mounted in a mount head of a component mounting machine, the mounting tool 20 is rotatably mounted around vertical axis V Attached to the vertically lower end of the tip holder is a mounting tool tip 1. This mounting tool tip is configured for engaging with a component to be picked and mounted by the mounting tool.

Furthermore, the mounting tool 20 is configured such that the tip portion 2 of the mounting tool tip 1 is off-center in a horizontal direction compared to the rotational axis (V). This may be achieved e.g. by having the lower portion of the tip holder 21 off-center to the rotational axis (V) or having a mounting tool tip 1 with a tip portion 2 that is off center in the horizontal direction.

Figure 1B:
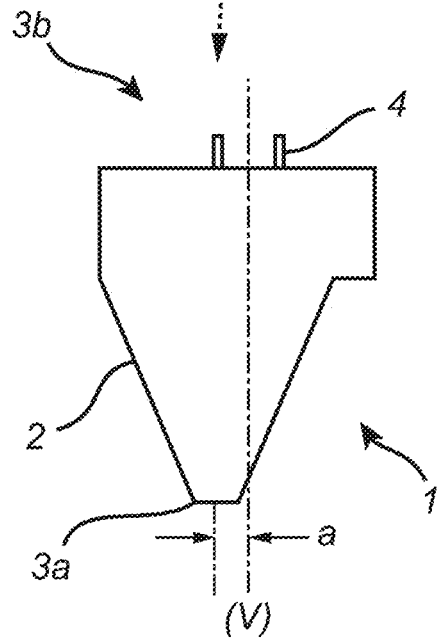
FIG. 1b is a schematic illustration of a mounting tool tip of a mounting tool.

FIG. 1b further illustrates a mounting tool tip 1 of a mounting tool 20 in which the tip portion 2 is off-center in the horizontal direction as compared to vertical rotational axis (V). This is illustrated by reference "a" in FIG. 1b.

The mounting tool tip 1 of the embodiment in FIG. 1b is arranged for being releasably mounted to the mounting tool 20 and comprises a tip portion 2 at a first end 3a. This tip portion 2 is thus the part of the mounting tool tip 1 that is arranged for engagement with a component (not shown in FIG. 1b) to be mounted in a component mounting machine. The tip portion 2 has in this embodiment a frustoconical shape with the base facing the second end 3b. However, the shape and the size of the tip portion 2 may depend on the size and type of component that are to be picked. As an example, the tip portion may have a pyramid shape.

The mounting tool tip further comprises engagement means 4 at a second end 3b that is opposite the first end 3a. The engagement means is thus used for mounting the mounting tool tip 1 to the mounting tool 20, and may be in the form of one or several pins extending from the second end. Such pin or pins may be configured to fit into holes or slits of a tip holder of a mounting tool, thereby forming a press fit or frictional fit with the mounting tool.

Furthermore, the engagement means 4 are arranged on the second end such that when mounted to the mounting tool 20, the tip portion 2 is off-center in a horizontal direction compared to the rotational axis (V), as illustrated by "a" in FIG. 1b. Distance "a" may be at least 100 μm, such as at least 200 μm, such as at least 250 μm.

Figure 2:
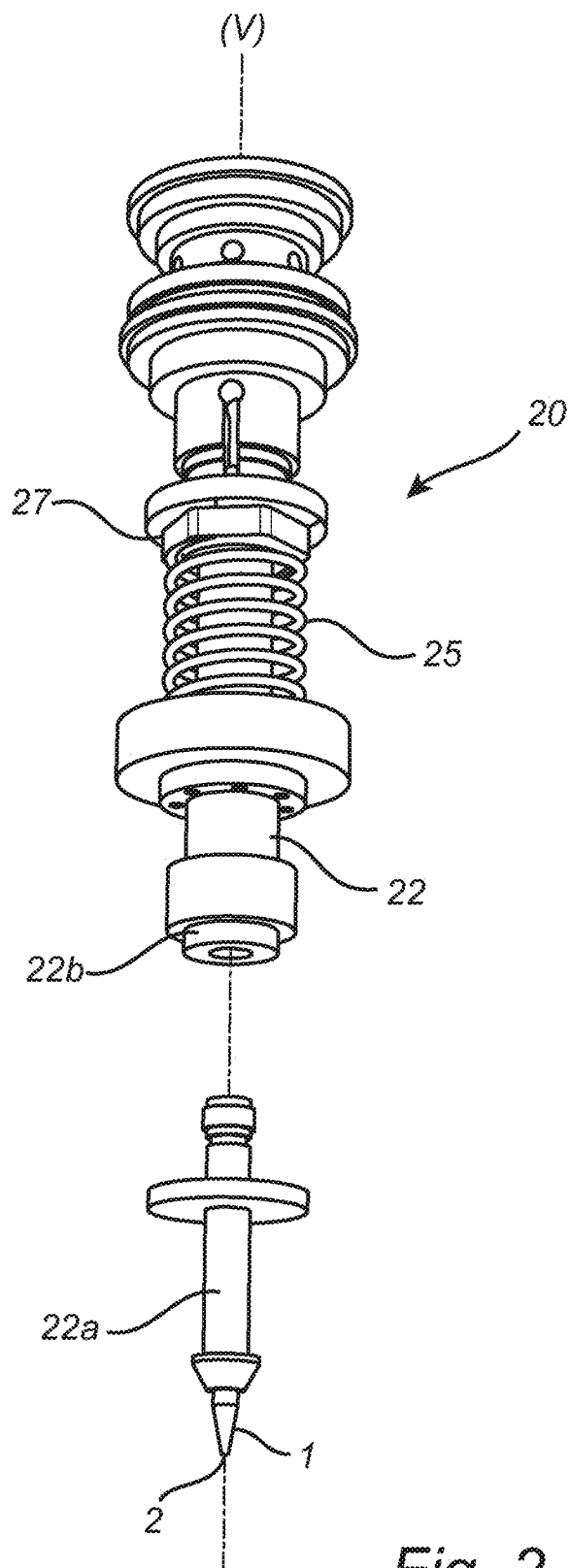
FIG. 2 is a further illustration of a mounting tool.

FIG. 2 is an illustration of a mounting tool 20 in which the base portion 21 has been removed from the mounting tool and instead been integrated in a mount head. As illustrated in FIG. 2, the tip holder 22 is spring loaded with a coiled spring 25 extending in the vertical direction around vertical axis (V). The coiled spring 25 is attached to the tip holder 22 and to the hexagonal portion 27 such that the tip holder 22 may be pressed down in the vertical direction against the elastic force of the coiled spring 25 when engaging a component 10 to be mounted.

As further illustrated in FIG. 2, the vertically lowermost portion of the tip holder 22 is a releasable portion 22a that is releasably mounted to the rest of the tip holder 22. The tip holder 22 comprises an upper shaft portion 22b to which the releasable portion 22a may be attached. The mounting tool tip 1 is attached to the releasable portion 22a. The upper shaft portion 22b, and thus also releasable portion 22a with the tip 1, are thus both rotatably arranged around vertical axis (V) and elastically mounted in the vertical direction when the mounting tool is mounted in a mount head of a component mounting machine.

The vertical shaft portion 22b may in itself be arranged within the base portion 21 so that is extends in the vertical direction in an off-center position in the horizontal direction relative the rotational axis V. A mounting tool tip 1 that is attached to such vertical shaft portion may thus be arranged off-center.

As an alternative, the releasable portion 22a may be off-center relative the vertical shaft portion 22b such that a mounting tool tip 1 attached to the releasable portion is off-center in the horizontal direction elative rotational axis (V).

As a further alternative, the vertical shaft portion 22b is aligned with the rotational axis (V) and the mounting tool tip 1 itself is configured such that the tip portion is off-center relative the rotational axis (V) when mounted to the mounting tool 22. Thus, the mounting tool tip 1 could be a mounting tool tip as discussed in relation to FIG. 1 b above.

Figure 3:
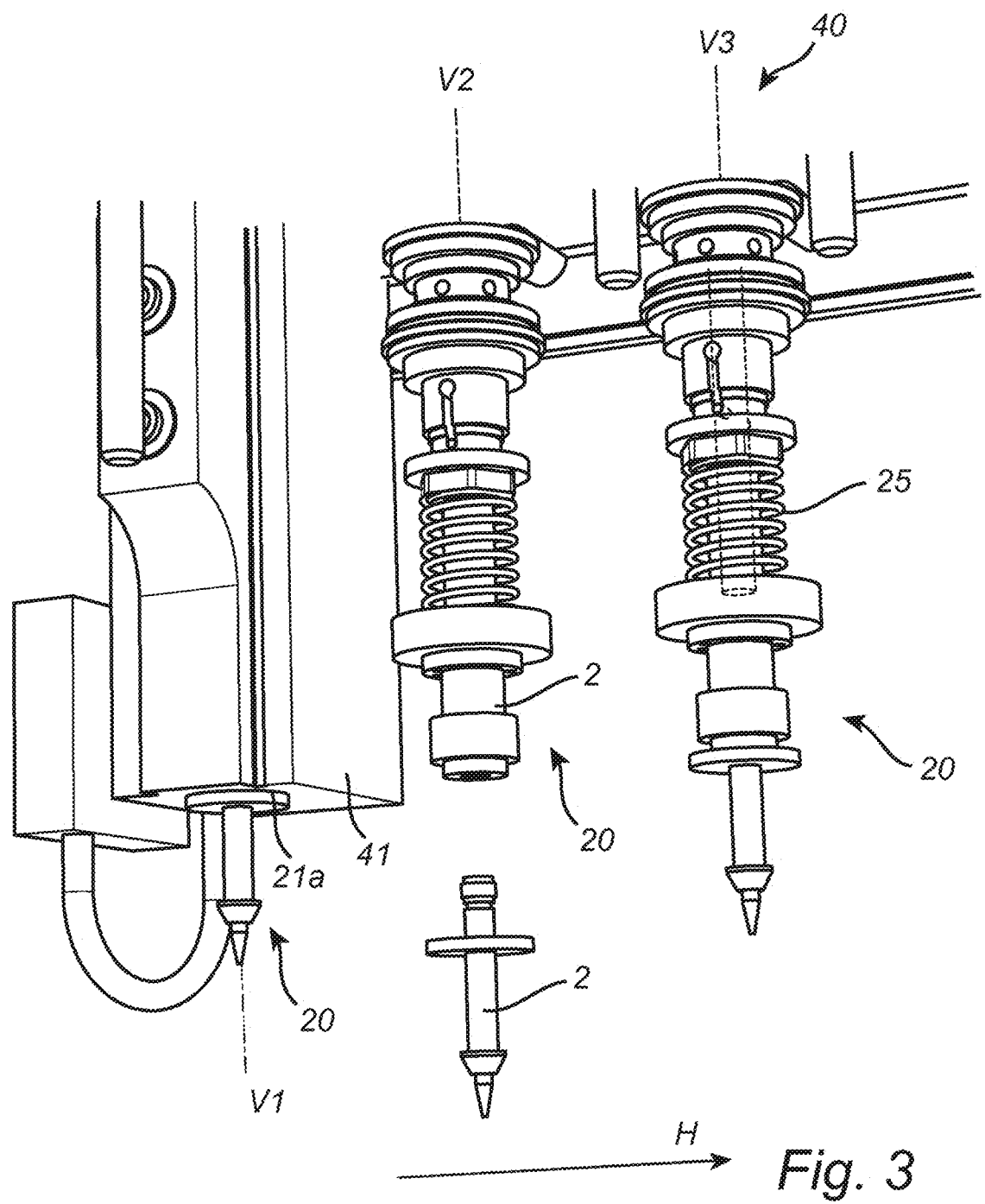
FIG. 3 is a schematic illustration of two mounting tools arranged in a mount head.

FIG. 3. shows a part of a mount head 40 for picking and placing a plurality of components in a component mounting machine. The mount head comprises a plurality of mounting tools 20 arranged along a horizontal direction H. In FIG. 3, only three mounting tools 20 are shown, but it is to be understood that several more mounting tools 20 may be arranged adjacent to the three shown. The mounting tools are e.g. as discussed in relation to FIGS. 1a and 2 above, and are adjacent to each other along a horizontal axis (H) and rotatably arranged around individual vertical rotational axes V1-V3. The individual mounting tools 20 are releasably attached to receiving portions 41 of the mount head 40. The receiving portions 41 comprises equipment for rotating the mounting tools around their rotational axes and for moving the mounting tools in the vertical direction when engaging a component to be mounted. As also illustrated in FIG. 3, the mounting tools have a releasable portion 22a that is releasably mounted to the rest of the tip holder 22 of the mounting tool 20. When engaging with a component to be picked, receiving portion 41 may move in the vertical direction. This movement, together with rotation of the mounting tool 20, may be used for positioning the mounting tool tip at a desired position. The coiled spring 25 reduces the impact force on the component at the actual pick and placing procedure.

Figure 4A:
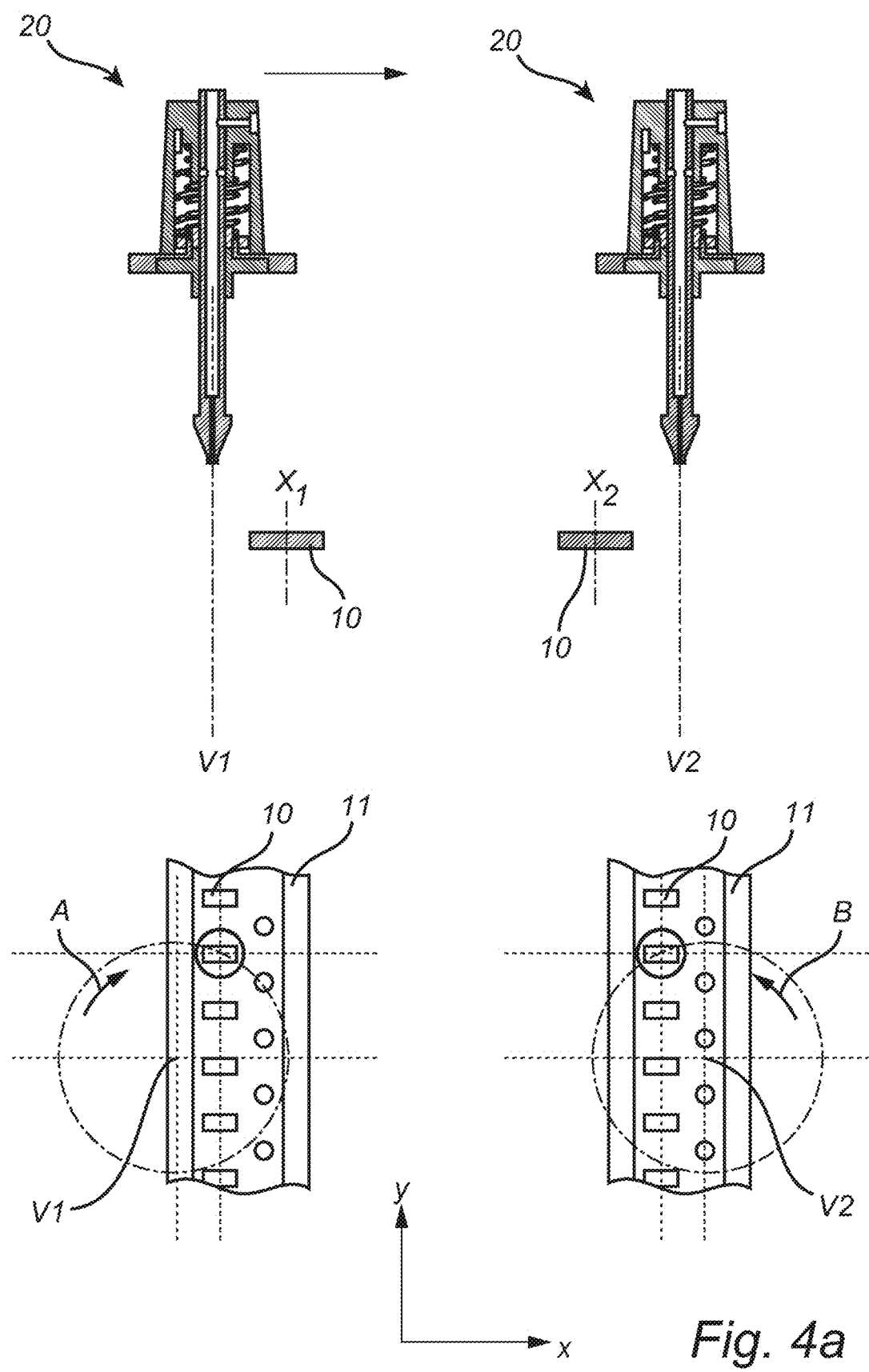
FIG. 4 schematically illustrates the rotation of the mounting tools to correct x coordinate.

FIG. 4a. illustrates a method of simultaneously picking components 10 arranged in adjacent component tapes 11 with two mounting tools 20 of the present invention. The mounting tools are arranged adjacent to each other along horizontal axis H, which is thus an axis extending in the x direction. In this example, two components 10 are picked simultaneously, but it is to be understood that more than two may be picked using the describe method. The components 10 are arranged at x coordinates x1 and x2, respectively. The x-y plane is thus the plane in which the upper side of the component tapes are arranged at the picking position of a component mounting machine. The component tapes may be arranged on component tapes and further be moved in positive or negative y direction by a feeding mechanism in a component mounting machine.

The mounting tools are rotatably arranged around individual rotational axes V1 and V2, which at first are not aligned with the positions of the components to be picked. After receiving information of the x and y coordinates of the components 10, the mount head to which the mounting tools 20 are attached positions the two mounting tools with their rotational axes V1 and V2 to the target x coordinates. This operation, i.e. receiving and moving the mounting tools, may be controlled by a control unit in a component mounting machine.

Thus, the mount head first makes a "rough" alignment of the mounting tools 20. As seen in FIG. 4a, the position of rotational axes V1 and V2 are not precisely at target x coordinates x1 and x2. However, due to the tip portions of the mounting tool tips being offset in the horizontal direction, i.e. offset relative the rotational axes V1 and V2 in the X-y plane, rotation of the mounting tools 20 around their rotational axes may finetune the x position of the tip portion. This is illustrated by arrows "A" and "B" in FIG. 4a. Rotation may be performed both clockwise or counter clockwise around rotational axes V1 and V2. Once the tip portions of the mounting tools 20 have the correct x-coordinates, i.e. the x1 and x2 coordinates of the components 10 to be picked, adjustments to also align tip portions with components 10 take place. This is achieved by adjusting the position of the whole component tape in the y-direction. Thus, the component tape feeding mechanism of the component mounting machine may be used for carefully adjusting the y positions of the components 10 to be picked once the mounting tools 20 have been rotated to the correct x-coordinates.

FIG. 4b summarizes the main steps of the method 100 for simultaneously picking at least two components 10 arranged in adjacent component tapes 11 in a component mounting machine. The method comprises the steps of
- a) receiving 101 x and y coordinates of the at least two components 10 in a horizontal plane perpendicular to the rotational axes (V);
- b) positioning 102 the mounting tools 20 of the mount head 40 to the x coordinate of the at least two components
- c) adjusting 103 the component tapes 11 in the y direction to the y coordinate of the at least two components 10; thereby aligning the components 10 under the tip portions 2 of the mount head 40; and
- d) picking 104 the at least two components 10 with the mount head 40.

As discussed above, step b) may comprise the sub steps of
- b1) positioning 102a the mount head such that the x coordinates of at least two mounting tools match the received x coordinates with a first positing error; and
- b2) rotating 102b the mounting tools of the mount head to the x coordinate of the at least two components to match the received x coordinates with a positioning error that is better than the first positioning error.

The method of the present disclosure thus makes it possible to pick components 10 when the horizontal distance, i.e. the distance in x direction, between the vertical rotational axes (V) of two adjacent mounting tools 2 is larger than the horizontal distance between the components 10 that are simultaneously picked from the two adjacent component tapes 11.

Accordingly, the method of the present disclosure also makes it possible to pick components 10 when the horizontal distance between the vertical rotational axes (V) of two adjacent mounting tools 20 is smaller or larger than the horizontal distance between the components 10 that are simultaneously picked from the two adjacent component tapes 11.

FIG. 5 illustrates two different designs of the tip portion 2. The tip portion 2 in FIG. 5a has a circular cross-section in the horizontal x-y plane. This thus makes it rotationally symmetric, i.e. it may cover the same area over a component 10 during the pick-and-place operation not matter how the mounting tool tip 2 has been rotated around axis (V) for matching the coordinates of the component 10 to be picked.

The tip portion 2 may also have a frusto-oval cross-section in the horizontal x-y plane. Thus, the tip portion 2 may for example be "rice shaped" which is advantageous in that it may cover a large area of a component 10 having a rectangular shape in the x-y plane, but still allow for a certain degree of rotational symmetry for a certain degree of rotation. When using a tip portion having a frusto-oval shape, the offset value may need to be larger, compared when using round shape, in order to adjust the X-coordinate to same amount with smaller change of rotation angle.

A tip portion 2 having a frusto-oval cross-section may provide a larger cover area between tip portion and component surface, thereby reducing the risk of dropping components and improving the ability to pick components.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method operatively associated with a component mounting machine for simultaneously picking at least two components arranged in at least two adjacent component tapes in the component mounting machine, said method comprising steps of:
   providing the component mounting machine including at least two mounting tools for picking and placing components within the component mounting machine and arranged adjacent to each other along a horizontal axis, rotatably arranged around individual vertical rotational axes, and including individual mounting tool tip portions each offset in a horizontal direction relative to a respective vertical rotational axis such that respective x and y coordinates of each mounting tool tip portion of each respective mounting tool in a horizontal plane perpendicular to the respective vertical rotational axis are adjustable by rotating the respective mounting tool around the respective vertical rotational axis, and a component tape feeding mechanism for feeding the at least two adjacent component tapes along a y-direction;
   receiving respective x and y coordinates of said at least two components in the horizontal plane;
   positioning said individual mounting tool tip portions to respective x coordinates of said at least two components, said positioning including rotating the at least two mounting tools around respective vertical rotational axes;
   adjusting said at least two adjacent component tapes in the y-direction to the y coordinates of said at least two components, thereby aligning said at least two components under said individual mounting tool tip portions; and
   picking said at least two components with said at least two mounting tools.

2. The method according to claim 1, wherein a horizontal distance between respective vertical rotational axes of two adjacent mounting tools is larger than a horizontal distance between said at least two components that are simultaneously picked from two adjacent component tapes.

3. The method according to claim 1, wherein a horizontal distance between respective vertical rotational axes of two adjacent mounting tools is smaller than a horizontal distance between said at least two components that are simultaneously picked from two adjacent component tapes.

* * * * *